United States Patent [19]
Te

[11] Patent Number: 6,009,031
[45] Date of Patent: Dec. 28, 1999

[54] SUPPLY LINE CONTROLLED SENSE AMPLIFIER

[75] Inventor: Sintiat Te, San Jose, Calif.

[73] Assignee: Advanced Array Corp, San Jose, Calif.

[21] Appl. No.: 09/135,872

[22] Filed: Aug. 18, 1998

[51] Int. Cl.[6] .................................................. G11C 7/00
[52] U.S. Cl. .................... 365/205; 365/190; 365/207; 365/208
[58] Field of Search .................... 365/149, 190, 365/205, 207, 208

[56] References Cited

U.S. PATENT DOCUMENTS

| | | | |
|---|---|---|---|
| 5,218,571 | 6/1993 | Norris | 365/189.09 |
| 5,267,203 | 11/1993 | Hwang et al. | 365/190 |
| 5,687,116 | 11/1997 | Kowshik et al. | 365/185.03 |
| 5,708,616 | 1/1998 | Choi | 365/205 |
| 5,726,562 | 3/1998 | Mizuno | 323/312 |

*Primary Examiner*—David Nelms
*Assistant Examiner*—Hien Nguyen
*Attorney, Agent, or Firm*—William L. Paradice III

[57] ABSTRACT

A sense amplifier includes cross-coupled latch has a PMOS bias transistor for selectively connecting the cross-coupled latch to a supply voltage and has an NMOS bias transistor for selectively connecting the cross-coupled latch to ground potential. The conductivity of the PMOS bias transistor is controlled by a first bias signal having a magnitude dependent upon the supply voltage and, in a similar manner, the conductivity of the NMOS bias transistor is controlled by a second bias signal also having a magnitude dependent upon the supply voltage. When the supply voltage exceeds a predetermined level, the first and second bias signals are of respective magnitudes so as to slowly turn on the PMOS and NMOS bias signals. In this manner, the current flow is gradually increased to the sense circuit at high voltages, thereby minimizing noise and power consumption. When, on the other hand, the supply voltage drops below the predetermined level, the first and second bias signals are of respective magnitudes so as to rapidly turn on the PMOS and NMOS bias transistor potential. In this manner, current flow to the sense circuit is maximized at low supply voltages, thereby improving speeds at low supply voltages.

15 Claims, 6 Drawing Sheets

SUPPLY LINE CONTROLLED SENSE AMPLIFIER

BACKGROUND

1. Field of Invention

This invention relates generally to memory arrays and specifically to sense amplifiers of a DRAM array.

2. Description of Related Art

Dynamic RAM (DRAM) constitutes the main memory of most personal computers and accounts for nearly 70% of the global semiconductor memory market. Since DRAM is less expensive and much slower than Static RAM (SRAM), system optimization requires a precise balance between DRAM's cost savings and DRAM's slower speeds. For example, while typical microprocessor speeds exceed 300 Mhz, DRAM speed is typically less than 100 Mhz. Thus, system optimization may be increased by increasing DRAM speed.

Further, DRAMs involve a tradeoff between supply voltage and speed. While higher supply voltages result in faster charging times, and thus greater DRAM speeds, fast charging times at high supply voltages result not only in increased power consumption but also in supply voltage fluctuations. These fluctuations in the supply voltage, in turn, may result in read speed fluctuation and even erroneous data interpretation. It is therefore desirable to compensate for these supply voltage fluctuations.

For example, a conventional DRAM 10 is shown in FIG. 1 as including a DRAM cell array 20 having a plurality of DRAM cells arranged in n+1 columns by m+1 rows. The cells in the DRAM array 20 are well known and are thus not shown in FIG. 1 for simplicity. The cells in a common row are coupled to an associated word line WL, and the cells in a common column are coupled to associated complementary bit lines BL and $\overline{BL}$. A plurality of sense circuits 30 are coupled between respective pairs of the complementary bit lines BL and $\overline{BL}$ and a sense logic circuit 40. A PMOS bias transistor MP1 selectively couples the sense circuits 30 to $V_{cc}$ in response to an enable signal Pbias, and an NMOS bias transistor MN1 selectively couples the sense circuits 30 to ground potential in response to an enable signal Nbias.

Referring to FIG. 2, the sense circuits 30 include a cross coupled latch formed by two CMOS inverters connected between the bias transistors MN1 and MP1. The input terminal of the first CMOS inverter, which is formed by an NMOS transistor MN2 and a PMOS transistor MP2, is coupled to the output terminal of the second CMOS inverter, which is formed by an NMOS transistor MN3 and a PMOS transistor MP3, and to the bit line BL, i.e., node N1. The input terminal of the second CMOS inverter is coupled to the output terminal of the first CMOS inverter and to the complementary bit line $\overline{BL}$, i.e., node N2.

The cells within the array 20 represent binary information by the presence or absence of charge therein. Thus, for instance, a cell within the array 20 represents a binary "1" when there is charge stored therein and, conversely, represents a binary "0" when there is no charge stored therein. Cells are selected for read operations in a well known manner using row address strobe ($\overline{RAS}$) and column address strobe ($\overline{CAS}$) signals. Specifically, the row address of a cell desired to be read is clocked into the DRAM 10 on the falling edge of the $\overline{RAS}$ signal. In response thereto, suitable row decoders (not shown) enable the word line WL corresponding to the received row address. Column addresses are clocked into the DRAM 10 on the falling edge of the $\overline{CAS}$ signal, thereby facilitating the latching of binary cell data from the selected row of cells into the sense circuits 30.

The sense circuits 30 are enabled on the falling edge of the $\overline{RAS}$ signal by driving signal Pbias to logic low, e.g., ground potential, and driving signal Nbias to logic high, e.g., $V_{cc}$. The low Pbias signal turns on PMOS bias transistor MP1 and thereby couples the sources of PMOS transistors MP2 and MP3 to $V_{cc}$, while the high Nbias signal turns on the NMOS bias transistor MN1 and thereby couples the sources of NMOS transistors MN2 and MN3 to ground potential. In order to avoid creating a short circuit between $V_{cc}$ and ground potential, signals Pbias and Nbias are not simultaneously enabled.

During read operations, a differential voltage develops across the complementary bit lines BL and $\overline{BL}$ associated with cells in the selected row. The polarity of this differential voltage depends upon the binary state of the cell, i.e., upon the presence or absence of charge therein. For instance, if a cell is charged, thereby representing a binary "1", its bit line BL is at a first voltage and its complementary bit line $\overline{BL}$ is at a second voltage, where the first voltage is greater than the threshold voltage of the CMOS inverters within the sense circuits 30 ($V_T$), and the second voltage is less than $V_T$. Conversely, if a cell is uncharged, thereby representing a binary "0", its bit line BL is at the second voltage and its complementary bit line $\overline{BL}$ is at the first voltage.

Once the sense circuits 30 are enabled, the differential voltage across the complementary bit line pairs BL and $\overline{BL}$ drives the cross-coupled latch within the associated sense circuit 30 to a corresponding binary state. For instance, if the selected cell is charged, i.e., representing a "1", the first voltage on the bit line BL turns on NMOS transistor MN2 and turns off PMOS transistor MP2, thereby driving node N2, and thus the complementary bit line $\overline{BL}$, low to ground potential. The low potential at node N2, in turn, turns on PMOS transistor MP3 and turns off NMOS transistor MN3, thereby driving node N1, and thus the bit line BL, high to $V_{cc}$. Conversely, if the selected cell is uncharged, the sense circuit 30 associated therewith drives the corresponding complementary bit lines BL and $\overline{BL}$ to ground potential and $V_{cc}$, respectively.

The differential voltages developed across the complementary bit lines BL and $\overline{BL}$ via the sense circuits 30 are decoded and then sensed in a well known manner in the logic sense circuit 40 which, in turn, provides an output signal OUT indicative of the binary state of the selected DRAM cell.

As mentioned above, the sense circuits 30 are simultaneously enabled by turning on the PMOS bias transistor MP1 and then the NMOS bias transistor MN1. Since typical DRAM arrays typically include 1024 or more columns, simultaneously enabling 1024 or more of the sense circuits 30 sources large currents from the supply voltage $V_{cc}$. These large currents sourced from $V_{cc}$ result not only in undesirable power consumption but also in unwanted noise. If sufficiently large, voltage supply noise may invalidate data and even damage associated logic.

Further, the current sourced to the sense circuits 30 may pull down the supply voltage $V_{cc}$ by as much as 20%. For instance, where $V_{cc}$ is a 3.0 volt supply, the simultaneous enabling of the sense circuits 30 may pull $V_{cc}$ down to 2.3 volts. Such fluctuations in $V_{cc}$ result in several problems, including data corruption, ground bounce, logic damage, junction breakdown, and so on.

In order to minimize supply voltage fluctuations resulting from enabling the sense circuits 30, additional PMOS bias transistors MP1(x) may be coupled between $V_{cc}$ and the sense circuits 30 and additional NMOS bias transistors MN1(x) may be coupled between ground potential and the sense circuits 30, as shown, for instance, in FIG. 3. Here, the bias transistors MP1(x) and MN1(x) are smaller in size, and thus current carrying capacity, than the respective bias transistors MP1 and MN1 shown in FIGS. 1 and 2. Further, buffer delays 32 are added in the Pbias and Nbias signal paths, as shown in FIG. 3, such that the bias transistors MP1(x) and MN1(x) are turned on in a sequential manner by respective signals Pbias and Nbias. In this manner, current sourced from $V_{cc}$ to the sense circuits 30 is gradually increased to a maximum value. As a result, power consumption and supply voltage noise resulting from current flow to the sense circuits 30 of FIG. 3 is reduced, as compared to that of FIG. 1.

However, replacing bias transistors MP1 and MN1 (FIG. 1) with numerous smaller respective bias transistors MP1(x) and MN1(x) (FIG. 3) undesirably degrades DRAM read speeds at low $V_{cc}$. For instance, where $V_{cc}$ is 2.7 volts, each of the bias transistors MP1(x) of FIG. 3 charges the cross-coupled latches within the sense circuits 30 to only 2.7 volts, as compared to 4 volts when a 4 volt $V_{cc}$ is utilized. As a result, gradually increasing current sourced from $V_{cc}$ to sense circuits 30 at low $V_{cc}$ in the manner described above with respect to FIG. 3 requires longer charge times. Thus, although advantageously reducing power consumption and noise at high $V_{cc}$, introducing delays into the Pbias and Nbias signal paths as illustrated in FIG. 3 will, at low $V_{cc}$, undesirably limit DRAM read speed.

SUMMARY

A sense circuit is disclosed herein which overcomes problems in the prior art mentioned above. In accordance with the present invention, a sense circuit includes cross-coupled latch and has a PMOS bias transistor for selectively connecting the cross-coupled latch to a supply voltage and has an NMOS bias transistor for selectively connecting the cross-coupled latch to ground potential. The conductivity of the PMOS bias transistor is controlled by a first bias signal having a magnitude dependent upon the supply voltage and, in a similar manner, the conductivity of the NMOS bias transistor is controlled by a second bias signal also having a magnitude dependent upon the supply voltage.

When the supply voltage exceeds a predetermined level, the first and second bias signals are of respective magnitudes so as to slowly turn on the PMOS and NMOS bias transistors. In this manner, current sourced from the supply voltage to the sense circuit is gradually increased to a maximum value, thereby minimizing noise and power consumption. When, on the other hand, the supply voltage drops below the predetermined level, the first and second bias signals are of respective magnitudes so as to rapidly turn on the PMOS and NMOS bias transistors. In this manner, current flow to the sense circuit is rapidly increased to a maximum value, thereby improving speeds at low supply voltages.

Like components in the Figures are similarly labeled.

DETAILED DESCRIPTION

The present invention is described below in the context of a DRAM 50 as shown, for instance, in FIG. 4. It is to be understood, however, that embodiments of the present invention are not limited to the specific examples provided herein, but. rather may be applied to other suitable semiconductor memory devices.

Figure 1:
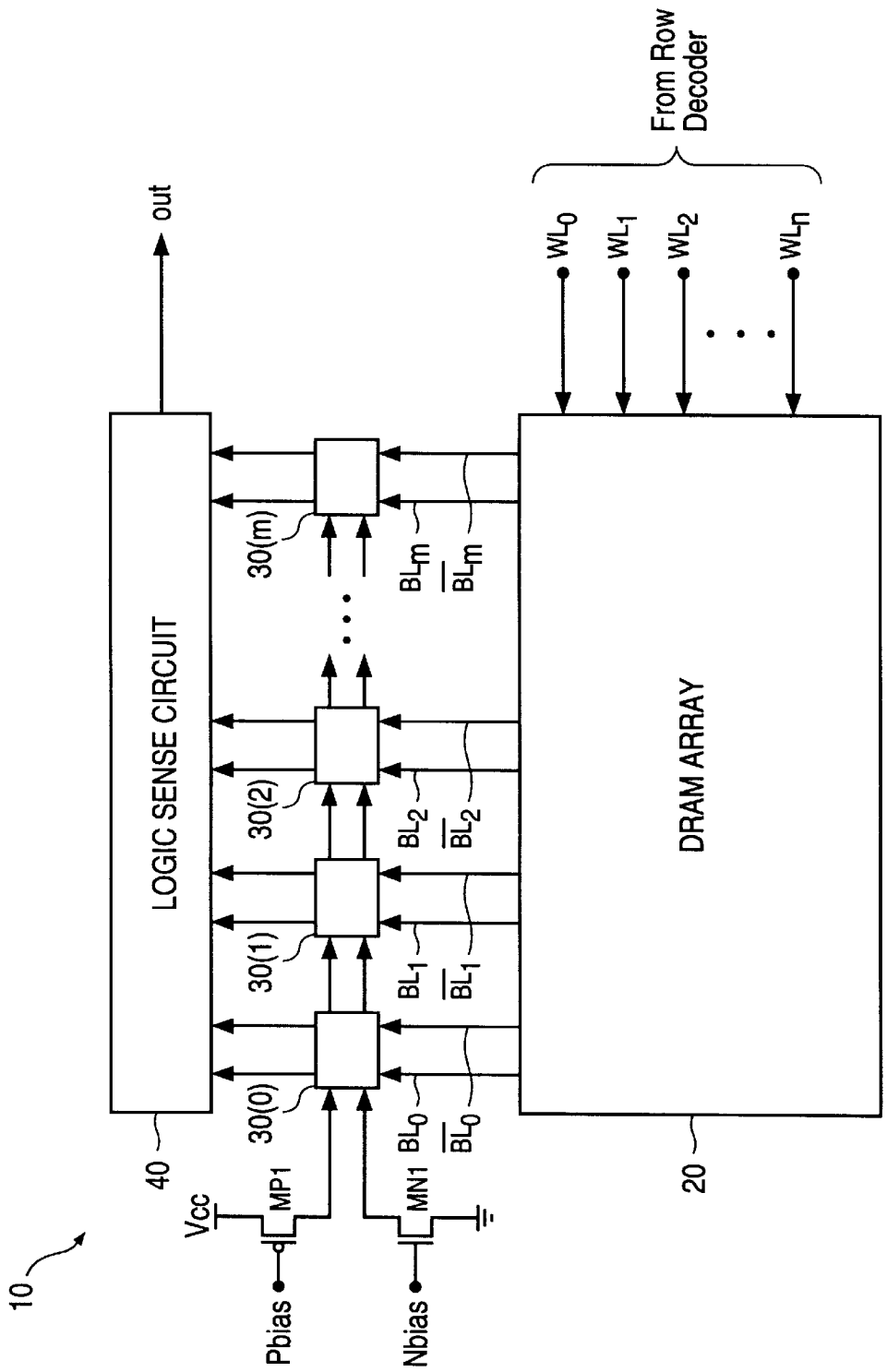
FIG. 1 is a block diagram of a conventional DRAM.
Figure 2:
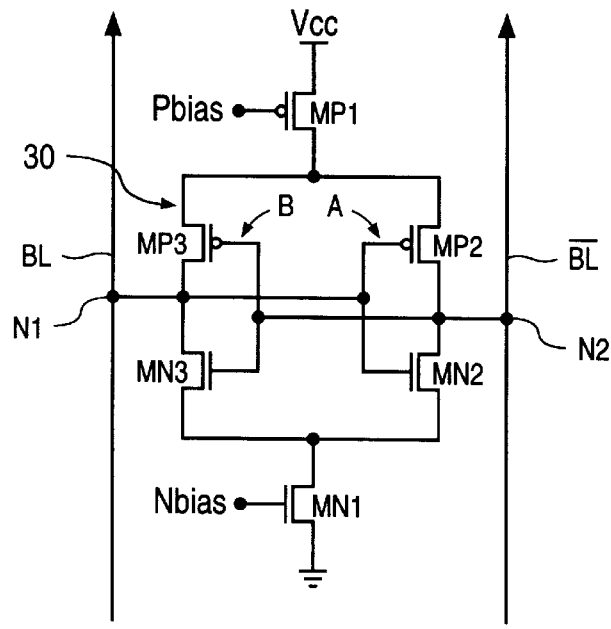
FIG. 2 is a schematic diagram of a sense circuit employed in the DRAM of FIG. 1.
Figure 3:
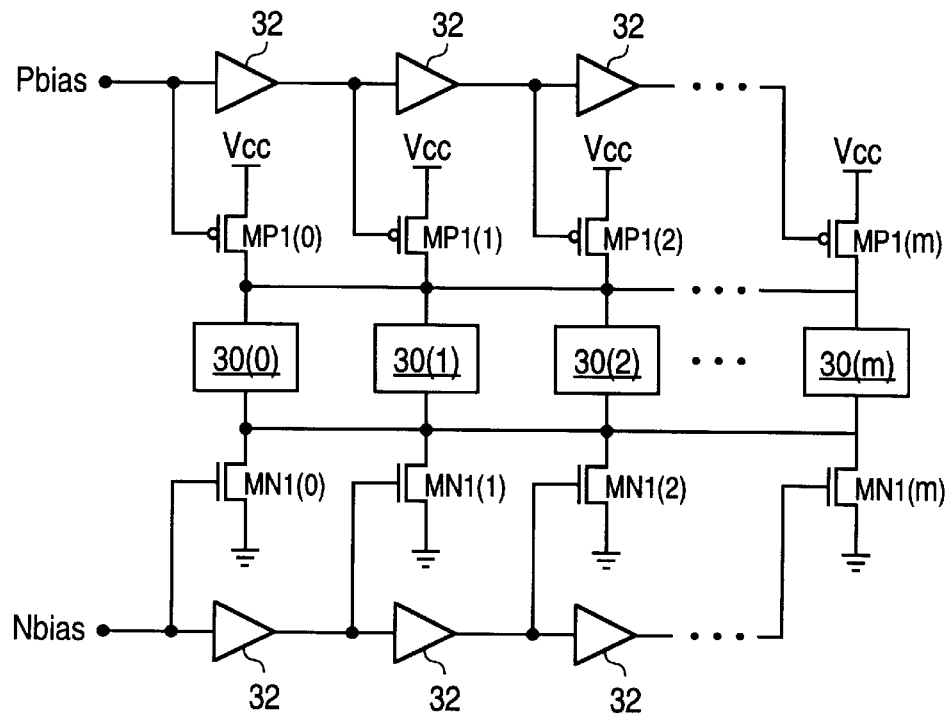
FIG. 3 is a schematic diagram one configuration of the sense circuits of FIG. 1 in which timing delays are introduced into the bias transistor enable signal paths.

In accordance with present embodiments, the DRAM 50 (FIG. 4), which incorporates some components of the DRAM 10 of FIG. 1, includes a control circuit 60 having first and second input terminals coupled to receive an enable signal EN and a $V_{cc}$ detection signal DET. In response to these input signals, the control circuit 60 provides the Pbias signal to the PMOS bias transistor MP1 via a first output terminal and provides the Nbias signal to the NMOS bias transistor MN1 via a second output terminal. As mentioned above, the sense circuits 30 are enabled by turning on the PMOS bias transistor MP1 and the NMOS bias transistor MN1, where the PMOS bias transistor MP1 connects the sense circuits 30 to the supply voltage $V_{cc}$ and the NMOS bias transistor MN1 connects the sense circuits 30 to ground potential.

The enable signal EN is an active high signal for enabling the control circuit 60. The signal DET is indicative of the magnitude of the supply voltage $V_{cc}$ and, as explained below, is used to control the amount of current sourced from $V_{cc}$ to the sense circuits 30. Preferably, the signal DET is a binary signal having a logic high state and a logic low state, where the high state indicates that $V_{cc}$ exceeds a predetermined threshold voltage and the low state indicates that $V_{cc}$ is less than or equal to the predetermined threshold voltage, although in some embodiments an analog signal which tracks $V_{cc}$ may be used. The signal DET is generated in a well known manner using, for instance, a comparator circuit having as input signals $V_{cc}$ and a reference voltage $V_{ref}$ equal to the above-mentioned predetermined threshold voltage. In some embodiments, $V_{ref}$ is approximately 3.4 V.

The control circuit 60 controls the current flow through the bias transistors MP1 and MN1 in response to the binary state of the signal DET and, in this manner, allows the current flow from $V_{cc}$ to the sense circuits 30 and from the sense circuits 30 to ground potential to be adjusted according to $V_{cc}$ levels. As mentioned above, when $V_{cc}$ is at a high level, e.g., greater than 3.4 volts, a rapid sourcing of current from $V_{cc}$ to the sense circuits 30 degrades DRAM performance in several ways, including pulling $V_{cc}$ below its nominal value and high power consumption. Further, when $V_{cc}$ is at a low level, e.g., below 3.4 volts, $V_{cc}$ should source a greater current in order to maintain speed of the DRAM 50.

Therefore, in accordance with the present invention, the control circuit 60 causes the bias transistors MP1 and MN1 to provide greater current flow to the sense circuit 30 when $V_{cc}$ is below the predetermined threshold voltage and lesser current when $V_{cc}$ is above the predetermined threshold voltage. In this manner, current flow through the sense circuits 30 is decreased during high $V_{cc}$ conditions in order to minimize the above-mentioned performance problems (e.g., $V_{cc}$ fluctuation and high power consumption), and current flow through the sense circuits 30 is increased during low $V_{cc}$ conditions in order to maintain speed.

Figure 5:
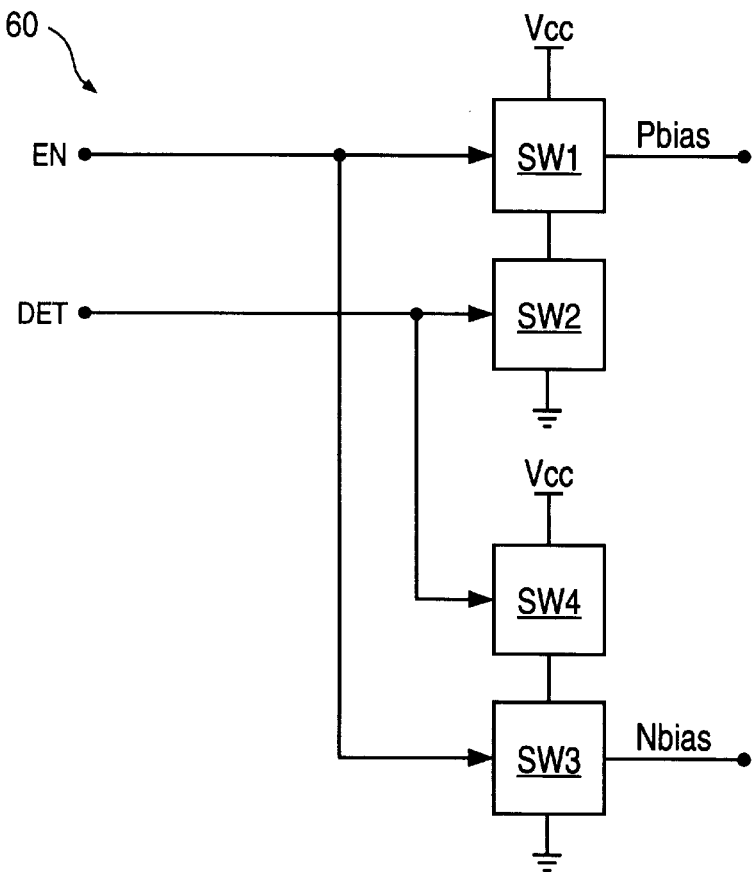
FIG. 5 is a block diagram of one embodiment of the control circuit of FIG. 4.

In some embodiments, the control circuit 60 includes four switches SW1–SW4 as shown, for instance, in FIG. 5. In response to the signal EN, the switch SW1 connects its output terminal, and thus the gate of PMOS bias transistor MP1, to either $V_{cc}$ or a first terminal of the switch SW2. The switch SW2 includes a second terminal connected to ground potential and adjusts current flow therethrough in response to the binary state of the signal DET. Similarly, in response to the signal EN, the switch SW3 connects its output terminal, and thus the gate of NMOS bias transistor MN1, to either ground potential or a first terminal of the switch SW4. The switch SW4 includes a second terminal connected to $V_{CC}$ and adjusts current flow therethrough in response to the binary state of the signal DET.

To commence operation of the control circuit 60, and thereby enable the sense circuits 30, the enable signal EN is held in a first logic state. In response thereto, switch SW1 connects its output terminal, and thus signal Pbias, to the first terminal of the switch SW2. Also, switch SW3 connects its output terminal, and thus signal Nbias, to the first terminal of the switch SW4. If $V_{cc}$ is above, for instance, 3.4 volts, the signal DET assumes a first binary state. In response thereto, the switch SW2 gradually turns on so as to gradually discharge signal Pbias toward ground potential, and the switch SW4 gradually turns on so as to gradually charge signal Nbias toward $V_{cc}$. The gradual discharging of signal Pbias, in turn, gradually turns on the PMOS bias transistor MP1 and thereby gradually increases current flow from $V_{cc}$ to the sense circuits 30. In a similar manner, the gradual charging of signal Nbias gradually turns on the NMOS bias transistor MN1 and thereby gradually increases current flow from the sense circuits 30 to ground potential. In this manner, performance problems associated with conventional high $V_{cc}$, e.g., $V_{cc}$ fluctuations and high power consumption, are minimized.

If, on the other hand, $V_{cc}$ falls below this predetermined level of 3.4 volts, the signal DET assumes a second binary state. In response thereto, switches SW2 and SW4 rapidly turn on and thereby rapidly discharge signal Pbias toward ground potential and rapidly charge signal Nbias toward $V_{cc}$, respectively. Accordingly, the bias transistors MP1 and MN1 turn on quickly so as to provide maximum current to the sense circuits 30. In this manner, charge rates within the sense circuits 30 are maximized at low $V_{cc}$ so to maintain DRAM speeds at low $V_{cc}$.

In some embodiments, the signal DET controls not only current flow rate, i.e., dI/dt, but also the maximum current flow provided to the sense circuits 30. In such embodiments, the signal DET allows for greater maximum current flow during low $V_{cc}$ conditions than at high $V_{cc}$ conditions.

Figure 6:
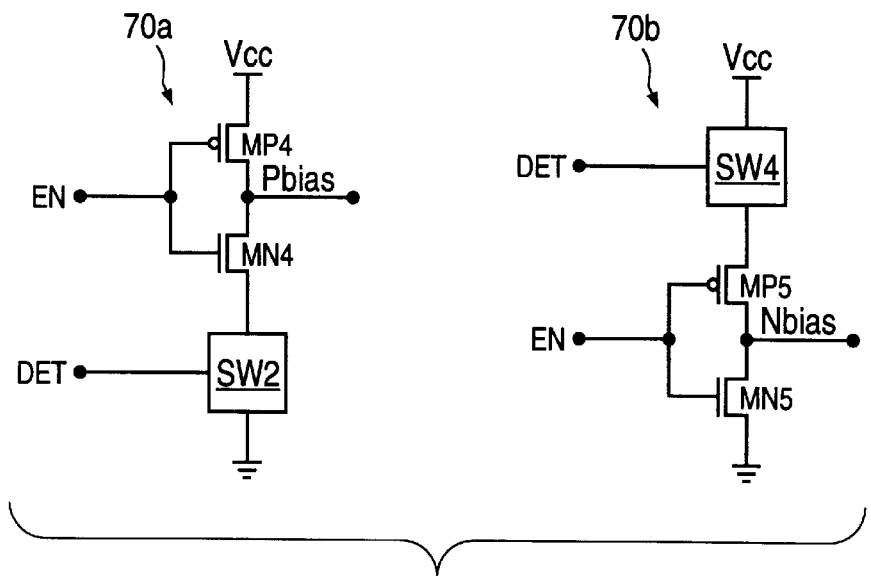
FIG. 6 is a schematic diagram of a switch used in one embodiment of the control circuit of FIG. 5.

In some embodiments, the switches SW1 and SW3 are standard CMOS inverters, as shown in FIG. 6. Here, the CMOS inverter 70a is employed as switch SW1 and is thus connected between $V_{cc}$ and the first terminal of the switch SW2, where the common gate of transistors MP4 and MN4 is coupled to receive the signal EN and the common drain of transistors MP4 and MN4 is coupled to the gate of PMOS bias transistor MP1 (see also FIG. 4). Similarly, the CMOS inverter 70b is employed as switch SW2 and is connected between ground potential and the first terminal of the switch SW4, where the common gate of transistors MP5 and MN5 is coupled to receive the signal EN and the common drain of transistors MP5 and MN5 is coupled to the gate of NMOS bias transistor MN1 (see also FIG. 4). Of course, other suitable selective connecting means such as, for instance, a multiplexer, may be employed as switches SW1 and SW3.

Further, the switches SW2 and SW4 may be any suitable switches in which the magnitude of current flow therethrough is controlled by a signal indicative of the $V_{cc}$ level, e.g., the signal DET. In some embodiments, the switches SW2 and SW4 are conventional MOS transistors having a gate coupled to receive the signal DET. In other embodiments, a voltage-controlled current source may be utilized.

Figure 7:
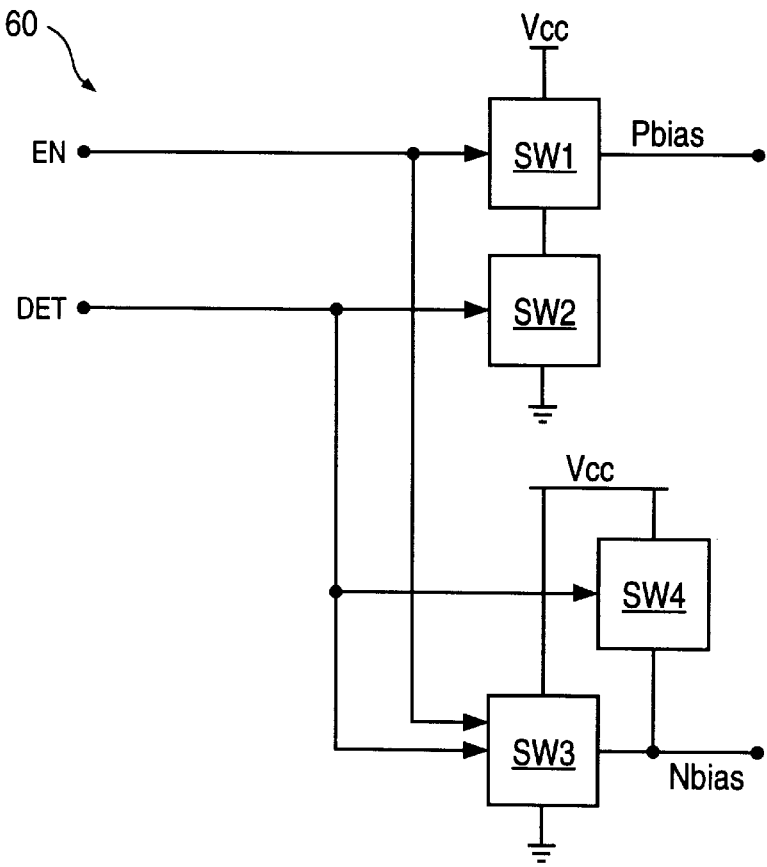
FIG. 7 is a block diagram of another embodiment of the control circuit of FIG. 4.

Another possible configuration of the switches SW1–SW4 is shown in FIG. 7. Here, the switch SW3 couples the Nbias signal to either $V_{cc}$ or ground potential in response to the signals EN and DET, and the switch SW4 couples the signal Nbias to $V_{cc}$ in response to the signal DET. Here, the configuration of switches SW1 and SW2 is identical to that described above with respect to FIG. 5.

To commence operation of the control circuit 60 shown in FIG. 7 so as to enable the sense circuits 30, the enable signal EN is held in a first logic state. In response thereto, switch SW1 couples signal Pbias to the first terminal of the switch SW2 and switch SW3 couples signal Nbias to $V_{cc}$. If $V_{cc}$ is above, for instance, 3.4 volts, the signal DET assumes a first binary state. In response thereto, the switches SW2 and SW3 gradually turn on so as to gradually increase current flow to the sense circuits 30. Here, the high signal DET maintains the switch SW4 in a non-conductive state.

If, on the other hand, $V_{cc}$ falls below this predetermined level of 3.4 volts, the signal DET assumes a second binary state. In response thereto, switch SW2 rapidly turns and thereby rapidly discharges the signal Pbias which, as discussed above, results in a maximum current flow from $V_{cc}$ to the sense circuits 30. Further, switches SW3 and SW4 rapidly turn on and thereby rapidly charge signal Nbias toward $V_{cc}$ which, as discussed above, results in maximum current flow through NMOS bias transistor MN1. Note that the parallel configuration of conducting switches SW3 and SW4 during low $V_{cc}$ conditions minimizes charging time for the signal Nbias. In this manner, DRAM speed is maintained during low $V_{cc}$ conditions.

Figure 8:
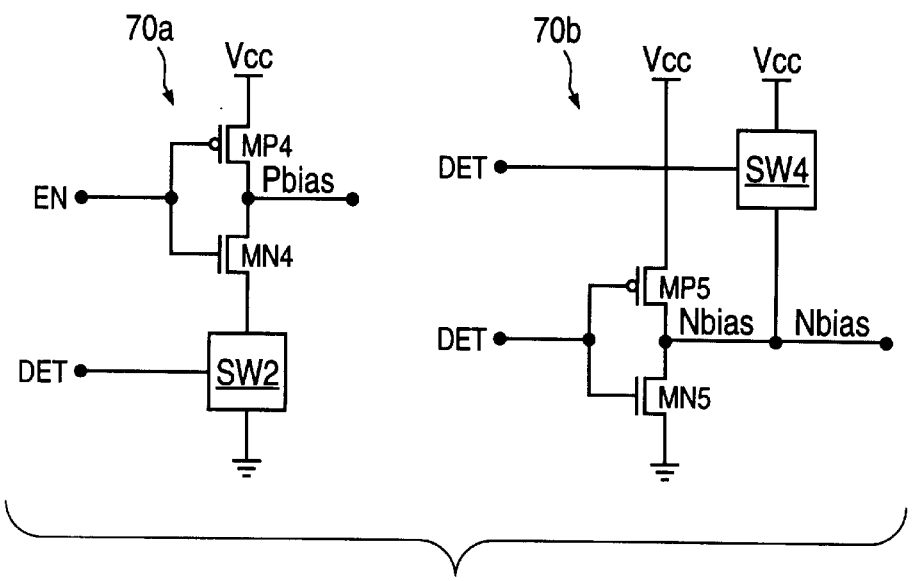
FIG. 8 is a schematic diagram of a switch used in one embodiment of the control circuit of FIG. 7.

Referring to FIG. 8, an embodiment of the control circuit of FIG. 7 is shown where switches SW1 and SW3 are standard CMOS inverters. As mentioned above, the switches SW2 and SW4 may be any suitable switches in which the magnitude of current flow therethrough is controlled by a signal indicative of the $V_{cc}$ level, e.g., the signal DET. In some embodiments, the switches SW2 and SW4 are conventional MOS transistors having a gate coupled to receive the signal DET. In other embodiments, a voltage-controlled current source may be utilized.

Figure 9:
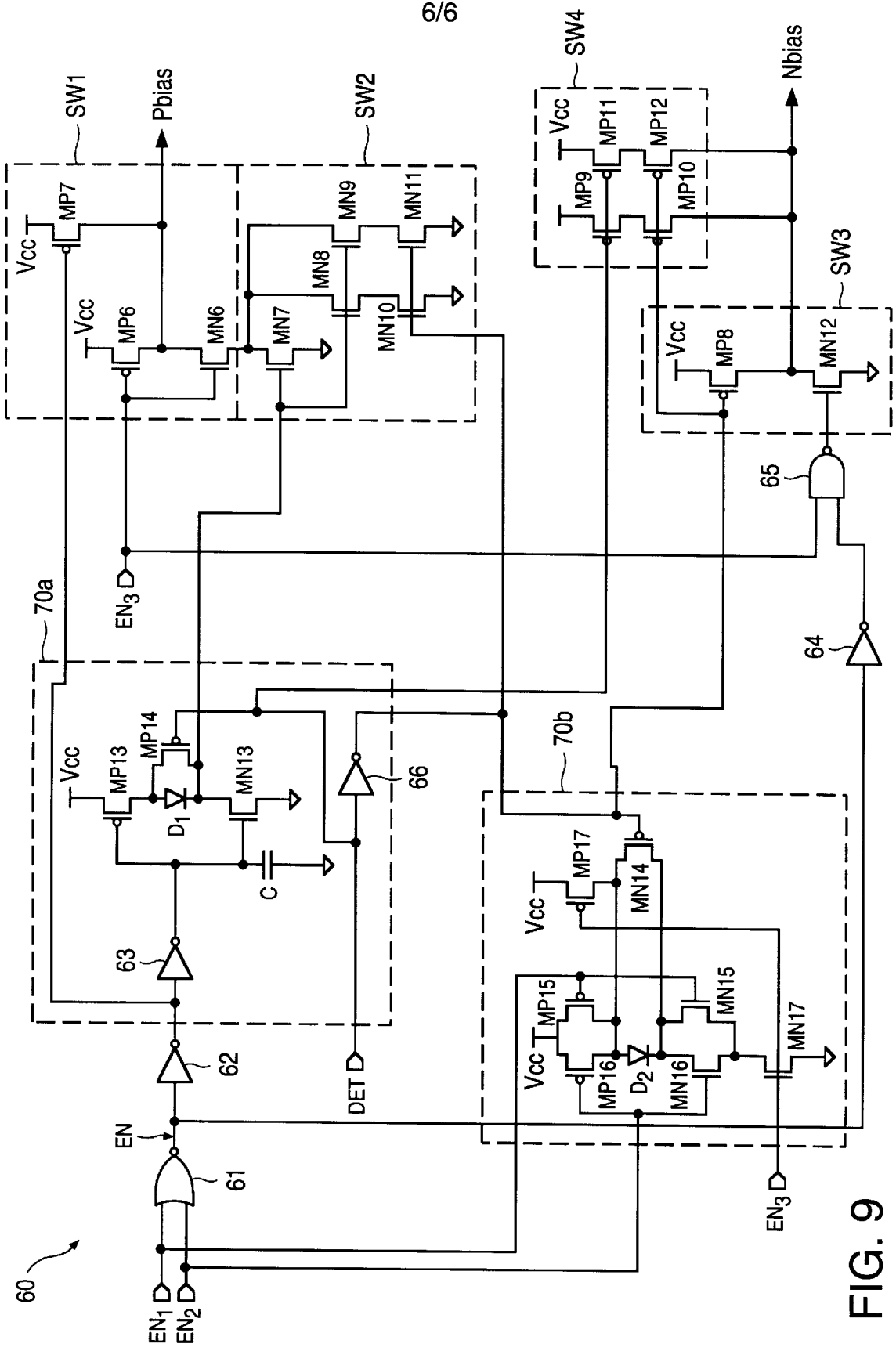
FIG. 9 is a schematic diagram of a control circuit used in a preferred embodiment of the present invention.

A preferred embodiment of the present invention is shown in FIG. 9 as having a configuration of the four switches SW1–SW4 similar to that depicted in FIGS. 7 and 8. As mentioned earlier, the control circuit 60 adjusts the rate at which current is provided to bias transistors MP1 and MN1 of the DRAM 50 in response to the $V_{cc}$ level, whereby current is provided to the sense circuits 30 more gradually when $V_{cc}$ is above 3.4 volts than when $V_{cc}$ is below 3.4 volts. Switch SW1 includes two PMOS transistors MP6 and MP7 connected in parallel between $V_{cc}$ and a first output terminal of the switch SW1 which, as discussed above with respect to FIG. 7, provides the bias signal Pbias. An NMOS transistor MN6 is connected between the output terminal of the first switch SW1 and a first terminal of the second switch SW2.

The second switch SW2 includes an NMOS transistor MN7 connected between transistor MN6 of the first switch SW1 and ground potential. NMOS transistors MN8 and MN9 are connected in parallel with transistor MN7 and are coupled to ground potential via respective NMOS transistors MN10 and MN11.

The third switch SW3 includes a PMOS transistor MP8 connected between $V_{cc}$ and the output terminal of the third switch SW3 which, as discussed above with respect to FIG. 7, provides the bias signal Nbias. The third switch SW3 also includes an NMOS transistor MN12 connected between the output terminal of the third switch and ground potential.

The fourth switch SW4 includes two transistor links connected in parallel between the output terminal of the third switch SW3 and $V_{cc}$, where the first link includes PMOS transistors MP9–MP10 and the second link includes PMOS transistors MP11 and MP12.

The control circuit 60 shown in FIG. 9 also includes first and second level shift circuits, where the first level shift circuit 70a provides control signals to the second switch SW2 and the second level shift circuit 70b provides control signals to the third switch SW3. Thus, the circuit 70a controls the discharging rate of the signal Pbias and, therefore, controls the current flow through the bias transistor MP1 (see FIG. 4). Similarly, the circuit 70b controls the charging rate of the signal Nbias and thereby controls the current flow through the bias transistor MN1 (see FIG. 4).

Figure 4:
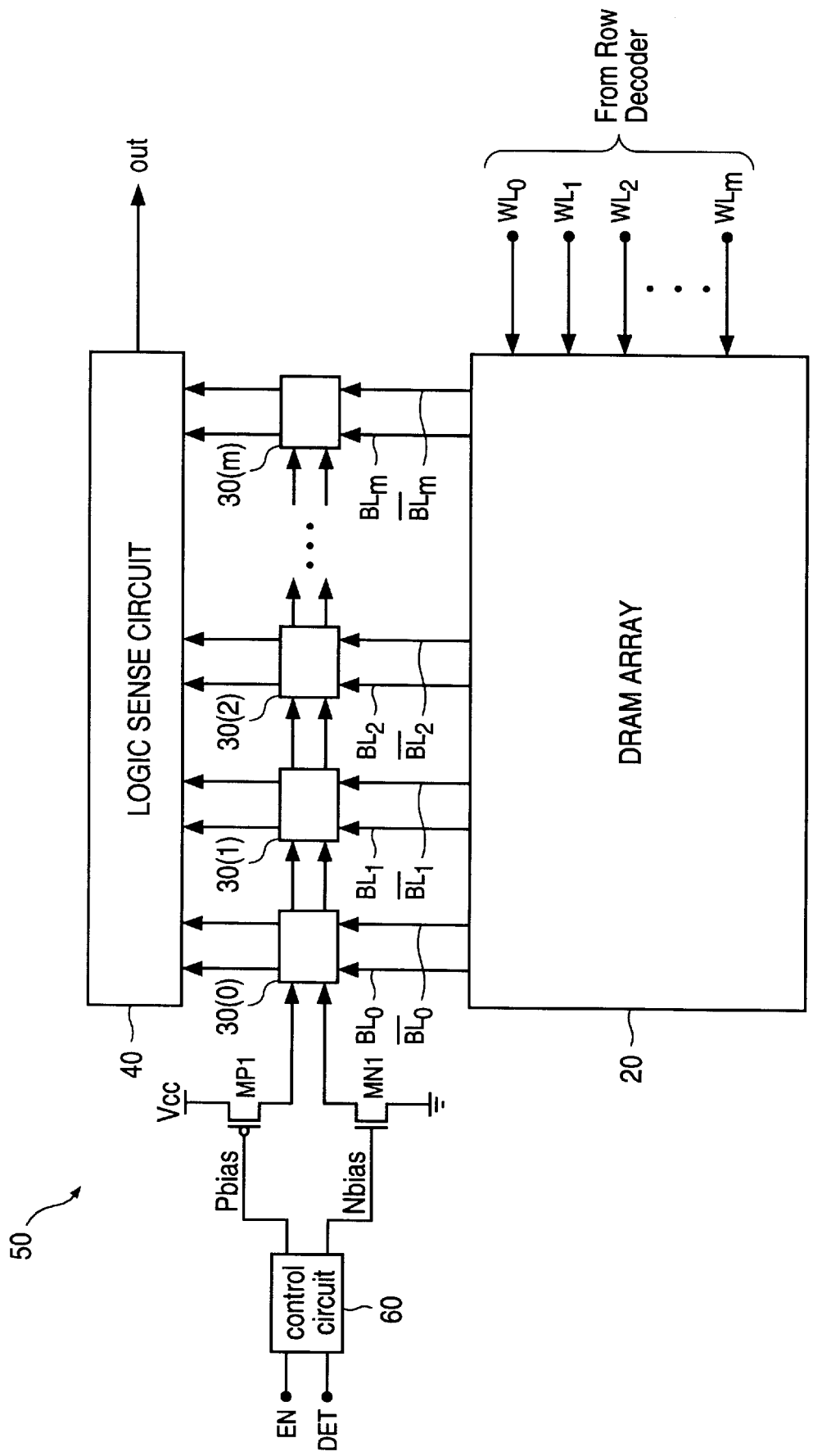
FIG. 4 is a block diagram of a DRAM employing sense circuits and a control circuit in accordance with the present invention.

First and second control signals $EN_1$ and $EN_2$ are combined in a NOR gate 61 to produce the enable signal EN which, as discussed in the context of the control circuit 60 shown in FIG. 9, must be in a logic low state to enable the associated bias transistors MP1 and MN1 of the DRAM 50 (see also FIG. 4). Thus, at least one of the control signals $EN_1$, and $EN_2$ must be in a logic high state to enable the sense circuits 30. However, for the purpose of discussion herein, control signals $EN_1$ and $EN_2$ are both assumed to be in a logic high state. The signal EN is logically complemented via an inverter 62 so as to provide a logic high signal to the gate of the PMOS transistor MP7. Thus, transistor MP7 is maintained in a non-conductive state and thereby isolates the signal Pbias from $V_{cc}$.

A logical complement of the enable signal generated by an inverter 64, e.g., $\overline{EN}$, is combined with a third control signal $EN_3$ in a NAND gate 65, the output terminal of which is connected to the gate of transistor MN12 of the third switch SW3. Thus, when the third control signal $EN_3$ is in a logic high state, the NAND gate 65 pulls the gate of transistor MN12 low to ground potential, thereby turning off transistor MN12 and isolating the signal Nbias from ground potential. The logic high state of the third control signal $EN_3$ is also coupled to the gates of transistors MP6 and MN6 of the first switch SW1. In this manner, transistors MP6 and MN6 are turned off and on, respectively, so as to couple the signal Pbias to the first terminal of the second switch SW2.

With respect to the level shift circuits 70a and 70b, the low signal EN turns on transistor MP13 and turns off transistor MN13, the high signal $EN_1$ turns off transistor MP15 and turns on transistor MN15, the high signal $EN_2$ turns off transistor MP16 and turns on transistor MN16, and the high signal $EN_3$ turns off transistor MP17 and turns on transistor MN17.

As mentioned above, the signal DET is logic high when $V_{cc}$ is greater than the predetermined threshold voltage, e.g., 3.4 volts. Here, the high signal DET turns off transistors MP14 of the circuit 70a and turns off transistors MP9 and MP11 of the fourth switch SW4. With transistor MP14 turned off, transistor MP13 pulls the gate of transistor MN7 to a voltage of only $V_{cc}-V_{D1}$, where $V_{D1}$ is the voltage drop across diode D1. The non-conducting transistors MP9 and MP11 effectively turn off the fourth switch SW4. The high signal DET is complemented via inverter 66 and provided as signal $\overline{DET}$ to the gates of transistors MN10 and MN11, thereby turning off transistors MN10 and MN11. As a result, the signal Pbias discharges to ground potential only through the transistor MN7. With the gate of transistor MN7 at $V_{cc}-V_{D1}$, transistor MN7 gradually turns on and thereby gradually charges the gate of the PMOS bias transistor MP1 of the DRAM 50. The maximum current flowing from Pbias to ground potential is controlled by manipulating the dimensions of the transistor MN7. The bias transistor MP1, in response to the gradual charging of its gate, gradually increases source current from $V_{cc}$ to the sense circuits 30. In this manner, $V_{cc}$ fluctuations and power consumption is reduced, as compared to the DRAM 10 of FIG. 1.

As mentioned above, transistors MN12, MP9 and MP11 are maintained in an off state when $V_{cc}$ is high, e.g., above 3.4 volts. As a result, the signal Nbias is charged toward $V_{cc}$ through only transistor MP8, the gate voltage of which is controlled by the circuit 70b. The low complement signal $\overline{DET}$ is coupled to the gate of the NMOS transistor MN14 and thereby maintains transistor MN14 in a non-conductive state. As a result, the gate of transistor MP8 is discharged to a voltage of $V_{D2}$, where $V_{D2}$ is the voltage drop across the diode D2. Thus, the transistor MP8 gradually turns on and thereby gradually charges the gate of the NMOS bias transistor MN1 toward $V_{cc}$. As a result, bias transistor MN1 slowly turns on and, therefore, slowly increases current flow from the sense circuits 30 to ground potential.

When, on the other hand, $V_{cc}$ is below 3.4 volts, the signal DET is in a logic low state. Transistor MP14 of the circuit 70a turns on and shunts diode D2 which, in turn, allows the gate of transistor MN7 to be charged to $V_{cc}$. As a result, transistor MN7 is quickly turned on to allow rapid discharging of the signal Pbias to ground potential. Further, the complement signal $\overline{DET}$ generated by the inverter 66 turns on transistors MN10 and MN11 of the second switch SW2, thereby providing additional current paths from Pbias to ground potential and thus further increasing the discharging of the signal Pbias. The resulting rapid discharging of the signal Pbias to ground potential quickly turns on the bias transistor MP1. In this case, the bias transistor MP1 quickly sources maximum current to the sense circuits 30.

The high complement signal $\overline{DET}$ turns on transistor MN14, thereby shunting the diode D2 and allowing transistors MN16 and MN17 of the circuit 70b to discharge the gate of transistor MP8 to ground potential. In response thereto, transistor MP8 quickly turns on to allow for a rapid charging of the signal Nbias. Further, the low signal DET turns on transistors MN9 and MN11 of the fourth switch SW4, thereby providing additional current paths between $V_{cc}$ and Nbias via transistors MP10 and MP12. As a result, Nbias is quickly charged to $V_{cc}$ which, in turn, quickly turns on the bias transistor MN1. Thus, at low $V_{cc}$, e.g., below 3.4 volts, current is quickly sourced to the sense circuits 30 to minimize any speed decrease resulting from the low $V_{cc}$.

In some embodiments, the third control signal $EN_3$ is eliminated, whereby the gates of transistors MP6 and MN6 are coupled to receive the complement signal $\overline{EN}$, and the gate of transistor MN12 is coupled to receive the signal EN. Where it is desirable to decrease the charging rate of the gate of transistor MP8, the first control signal $EN_1$ is held in a logic low state so as to turn on transistor MP15 and turn off transistor MN15.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A DRAM comprising:

an array having a plurality of columns of memory cells;

a plurality of sense circuits coupled to respective ones of said plurality of columns;

a first bias transistor connecting said sense circuits to a first voltage supply;

a second bias transistor connecting said sense circuits to a second voltage supply; and means for controlling current flow through said bias transistors in response to a detection signal indicative of the voltage level of said first voltage supply such that said bias transistors provide more current to said sense circuits when said voltage supply falls below a predetermined threshold voltage and provides less current to said sense circuits when said voltage supply exceeds said predetermined threshold voltage.

2. The apparatus of claim 1, wherein said predetermined threshold voltage is approximately 3.4 volts.

3. The apparatus of claim 1, wherein said means for controlling comprises:

a first switch for selectively connecting a gate of said first bias transistor to either a first node or a second node in response to an enable signal; and a second switch connected between said second node and ground potential and having a control terminal for controlling the magnitude of current flowing therethrough in response to said detection signal.

4. The apparatus of claim 3, wherein said first node comprises said first voltage supply.

5. The apparatus of claim 3, wherein said first switch comprises a CMOS inverter connected between said first voltage supply and said second switch, said CMOS inverter having an input terminal coupled to receive said enable signal and having an output terminal connected to said gate of said first bias transistor.

6. The apparatus of claim 5, wherein said second switch comprises an MOS transistor having a gate coupled to receive said detection signal.

7. The apparatus of claim 3, wherein said means for controlling further comprises:

a third switch for selectively connecting a gate of said second bias transistor to either said first node or said second node in response to said enable signal; and a fourth switch connected between said second node and ground potential and having a control terminal for controlling the magnitude of current flowing therethrough in response to said detection signal.

8. The apparatus of claim 7, wherein said first node comprises said second voltage supply.

9. The apparatus of claim 7, wherein said third switch comprises a CMOS inverter connected between ground potential and said fourth switch, said CMOS inverter having an input terminal coupled to receive said enable signal and having an output terminal connected to said gate of said second bias transistor.

10. The apparatus of claim 7, wherein said fourth switch comprises an MOS transistor having a gate coupled to receive said detection signal.

11. The apparatus of claim 3, wherein said means for controlling further comprises:

a third switch for selectively connecting a gate of said second bias transistor to either said first node or said second node in response to said enable signal; and a fourth switch connected between said gate of said second bias transistor and said first node and having a control terminal for controlling the magnitude of current flowing therethrough in response to said detection signal.

12. The apparatus of claim 11, wherein said first node comprises said first voltage supply and said second node comprises ground potential.

13. The apparatus of claim 11, wherein said third switch comprises a CMOS inverter connected between ground potential and said voltage supply, said CMOS inverter having input terminals coupled to receive said enable signal and said detection signal and having an output terminal connected to said gate of said second bias transistor.

14. The apparatus of claim 11, wherein said fourth switch comprises an MOS transistor having a gate coupled to receive said detection signal.

15. A method of sourcing current to sense circuits coupled to bit lines of a memory cell array, said method comprising the steps of:

determining whether a supply voltage exceeds a predetermined threshold voltage; and adjusting a rate of current flow from said supply voltage to said sense amplifiers in response to said determining step.

* * * * *